us005745067A

United States Patent [19]

Chou et al.

[11] Patent Number: 5,745,067
[45] Date of Patent: Apr. 28, 1998

[54] TWO [STEP] STAGE ANALOGE-TO-DIGITAL CONVERTER HAVING UNIQUE FINE ENCODING CIRCUITRY

[75] Inventors: Shu-Kuang Chou; Yung-Yu Lin, both of Taipei; Hsueh-Wu Kao, Hsinchu, all of Taiwan

[73] Assignee: Industrial Technology Research Institute, Hsinchu, Taiwan

[21] Appl. No.: 682,455

[22] Filed: Jul. 17, 1996

[51] Int. Cl.$^6$ ............................................ H03M 1/16
[52] U.S. Cl. ............................................ 341/156
[58] Field of Search ............................................ 341/156

[56] References Cited

U.S. PATENT DOCUMENTS

| | | | |
|---|---|---|---|
| 4,733,217 | 3/1988 | Dingwall | 340/347 |
| 4,903,028 | 2/1990 | Fukushima | 341/156 |
| 5,126,742 | 6/1992 | Schmidt et al. | 341/156 |
| 5,223,836 | 6/1993 | Komatsu | 341/156 |
| 5,291,198 | 3/1994 | Dingwall et al. | 341/159 |
| 5,302,869 | 4/1994 | Hosotani et al. | 307/518 |
| 5,349,354 | 9/1994 | Ito et al. | 341/156 |
| 5,353,027 | 10/1994 | Vorenkamp et al. | 341/156 |
| 5,369,309 | 11/1994 | Bacrania et al. | 327/94 |
| 5,387,914 | 2/1995 | Mangelsdorf | 341/156 |
| 5,389,929 | 2/1995 | Nayebi et al. | 341/156 |
| 5,397,936 | 3/1995 | Wang | 327/97 |
| 5,400,029 | 3/1995 | Kobayashi | 341/156 |
| 5,581,255 | 12/1996 | Hsu | 341/156 |
| 5,631,650 | 5/1997 | Hsu | 341/155 |

*Primary Examiner*—Jeffrey A. Gaffin
*Assistant Examiner*—Jason H. Vick
*Attorney, Agent, or Firm*—George O. Saile; Stephen B. Ackerman

[57] ABSTRACT

An analog to digital converter for the conversion of an analog input signal to a digital output code of n bits has a plurality of voltage references created in a voltage reference generator that divides the total range of voltage of the conversion input into increments of voltage equal to the smallest increment of resolution. The n bits of digital output are divided into most significant bits and least significant bits. The most significant bits are encoded from a set of digital signals that are formed in a set of coarse comparators, that compare the analog input signal with a subset of the voltage references representing the coarse range. The digital code that is the output of the coarse comparators is used to determine the selection of the subset of the plurality of the voltage references that are the fine voltage references. The least significant bits are encoded from a set of digital signals that are formed in a set of fine comparators that compare the analog input signal to the fine voltage references. The digital codes that form the most significant bits and the least significant bits are corrected encoded in an output encoder to form the digital output word.

28 Claims, 8 Drawing Sheets

TWO [STEP] STAGE ANALOGE-TO-DIGITAL CONVERTER HAVING UNIQUE FINE ENCODING CIRCUITRY

BACKGROUND OF INVENTION

1. Field of the Invention

The present invention relates generally to Analog to Digital (A/D) converters and converting methods, and more particularly to multi-stage parallel type converters which use the first stage of conversion to determine the coarse range of the input voltage and a subsequent stages to resolve the analog input signal to finer increments. The present invention has applicability to video and digital signal processing.

2. Description of the Background Art

The application of digital processing and transmission methods to analog information requires a technique for the conversion of signals from their analog form to a digital representation. Well known types of A/D converters include the Successive Approximation type which produces a digital output using a digital to analog converter to create successive trial and error approximations of the input, and the parallel comparator type or FLASH converter, which compares multiple voltage references to the input voltage and outputs from the encoding logic the digital code representing the voltage reference closest to the input voltage in one operation. FIG. 1 shows a representation of the FLASH type of A/D Converter. Typically the output is a binary code that is constructed in the Encoder Logic 30 thus providing an n bit resolution of the input signal. This structure typically requires $2^n$ voltage references 10 and $2^n$ comparators 20. As the resolution of this type of converter is improved (the number of output bits increases), the design becomes unwieldy.

In order to simplify the design of the FLASH A/D Converter, two techniques are known. In both techniques, multiple stages of conversion are used accomplish the A/D conversion. In the first technique, as shown in U.S. Pat. No. 5,302,869 (Hosotani et al.), U.S. Pat. No. 5,389,929 (Nayebi et al), U.S. Pat. No. 5,353,027 (Vorenkamp et al.), U.S. Pat. No. 5,369, 309 (Bacrania et al.),and U.S. Pat. No. 5,387,914 (Mangelsdorf), the first stage is a coarse resolution FLASH A/D conversion and the second stage, with a Digital to Analog Converter, adjusts the voltage references of the voltage comparators to form a fine resolution conversion. The results of the two conversions are encoded to form the digital output word representing the magnitude of the analog input voltage. In the second technique, as shown in U.S. Pat. No. 5,291,198 (Dingwall et al.), U.S. Pat. No. 5,223,836 (Komatsu), U.S. Pat. No. 5,400,029 (Kobayashi), U.S. Pat. No. 4,733,217 (Dingwall), U.S. Pat. No. 5,349,354 (Ho, et al.) there will be multiple conversion stages with voltage references being appropriately switched to each stage by decision logic based on the results of the previous comparison stages.

As an example of the second techniques of multiple stage conversion, see in FIG. 2., which is a schematic diagram of U.S. Pat. No. 4,903,028 (Fukashima), that by creating a set of voltage sources 1 that have incrementally increasing values from $V_{REFBOT}$ (the lowest value) to $V_{REFTOP}$ (the highest value) establishes the range of conversion of the voltage input ($V_{in}$). A set of Coarse Subrange Comparators 2 are connected to the voltage input and to the set of voltage references at discrete intervals establishing the coarse subranges $1a$, $1b$ of $V_{in}$. The output of the Coarse Subrange Comparators 5 is the input to a Steering Logic and Switch Unit 3 that places a set of Fine Subrange Comparators 4 at the appropriate Subrange of the Voltage Reference Set 1. The set of Voltage References $1a$ are divided into fine increments establishing the maximum resolution of the conversion of $V_{in}$ to Digital Output $\{D0, D1, D2, \ldots, Dn\}$. As $V_{in}$ changes the value of the output codes or the Coarse Subrange Comparators 5 change and the Steering Logic and Switch Unit 3 moves the Fine Subrange Comparators 4 to the next subrange (from $1a$ to $1b$).

Due to the tolerances in component selection and process variation, the Output Codes 5 of the Coarse Subrange Comparators 2 may be in error. To detect this error, there will be Extra Fine Subrange Comparators $4a$ & $4b$ that will be placed above and below the subrange $1a$ or $1b$ determined by $V_{in}$. The output of the Extra Fine Comparators $4a$ & $4b$ form an error code 7. The output codes for Fine Subrange Comparators 6, the set of error codes 7, and the set of Coarse Subrange Codes 5 are interpreted by the Output Encoding Logic 8 to determine the output digital representation $\{D0, D1, D2, \ldots, Dn\}$, of the voltage input $V_{in}$.

In the foregoing, there are two sets of error detection circuits. The error correction function is stimulated on only one side of the Coarse Subrange on each comparison cycle of the Fine Subrange comparators. This type of configuration consumes additional power and adds additional complexity to the physical implementation. To reduce the number of extra comparators and simplify the complexity of the physical structure, patent application Ser. No. 08/497,881, and now issued as U.S. Pat. No. 5,581,255 (Hsu), assigned to the same assignee as the present invention, as shown in FIG. 3, uses a set of Embedded Coarse Subrange Comparators 140. The reference codes generated by the Embedded Coarse Comparators determine the proper reference range for the Fine Subrange Comparators 160. The codes from the Coarse Subrange Comparators 170, the Embedded Coarse Subrange Comparators 180, and the Fine Subrange Comparators 190 are encoded to form the output digital code. The selection to the placement of the Embedded Coarse Subrange Comparators 140 input references 131 are determined by the Embedded Coarse Subrange Selection Logic and Switches 130 from the input codes of the Coarse Subrange Comparators 170. The placement of the Fine Subrange Comparators References 151 are determined by the Fine Subrange Selection Logic and Switches 150 with input from the Coarse Subrange Comparators 170 and the Embedded Coarse Comparators 180.

SUMMARY OF THE INVENTION

An object of this invention is the reduction of complexity in the physical implementation of parallel analog-to-digital converters. Another object of this invention is the reduction in power consumption by the elimination of unneeded circuitry.

FIG. 7 shows a timing diagram of this invention. The coarse A/D converter 730 and the fine A/D converter 760 sample the incoming signal 735 and 765 during the first half clock cycle 705. Then the coarse A/D converter 735 performs a compare function 740 on the input data sample 735 during the beginning of the second half cycle 710. The results of this compare function 740 determine the coarse digital codes of the input data sample 735 and selects the reference voltages necessary for the fine A/D converter 760. During the end of the second half cycle 710, the input data sample 765 can be compared by the fine A/D converter 760 and the fine digital codes or the input data sample 765 are determined. This allows the digital codes of the DATA 1 805 (the combination of the coarse digital codes and fine digital codes of the input sampled data 735 and 765) to be determined during one clock cycle. The coarse A/D converter 730 and the fine A/D converter 760 can acquire a second sample of the input signal 745 775 during the second clock cycle 715 and a second fine A/D converter is not required.

To accomplish the above objects the Two Step A/D converter has a coarse resolution A/D converter and a fine A/D converter. A sample and hold circuit samples an incoming analog input voltage at discrete periods of time and retains the sample of the analog input voltage as an input signal source for the coarse A/D converter and fine A/D converter. A voltage reference generator is coupled between two reference voltage sources to create a plurality of voltage references.

The coarse A/D converter is connected to the sampled analog input signal which is compared to a coarse set of voltage references from the voltage reference generator to create a coarse digital code. The coarse digital code is passed to a reference voltage selection logic means which is connected to a voltage reference selection switch to select a set of the plurality of reference voltages which are the fine reference voltages.

The fine A/D converter is connected to the sampled input signal which is compared the fine reference voltages to form a fine digital code.

The coarse digital code and the fine digital code are translated and the coarse digital code is corrected in the output encoding means to form the output digital code. The output digital code is a binary number representing the magnitude of the analog input voltage.

DETAILED DESCRIPTION OF THE INVENTION

Figure 1:
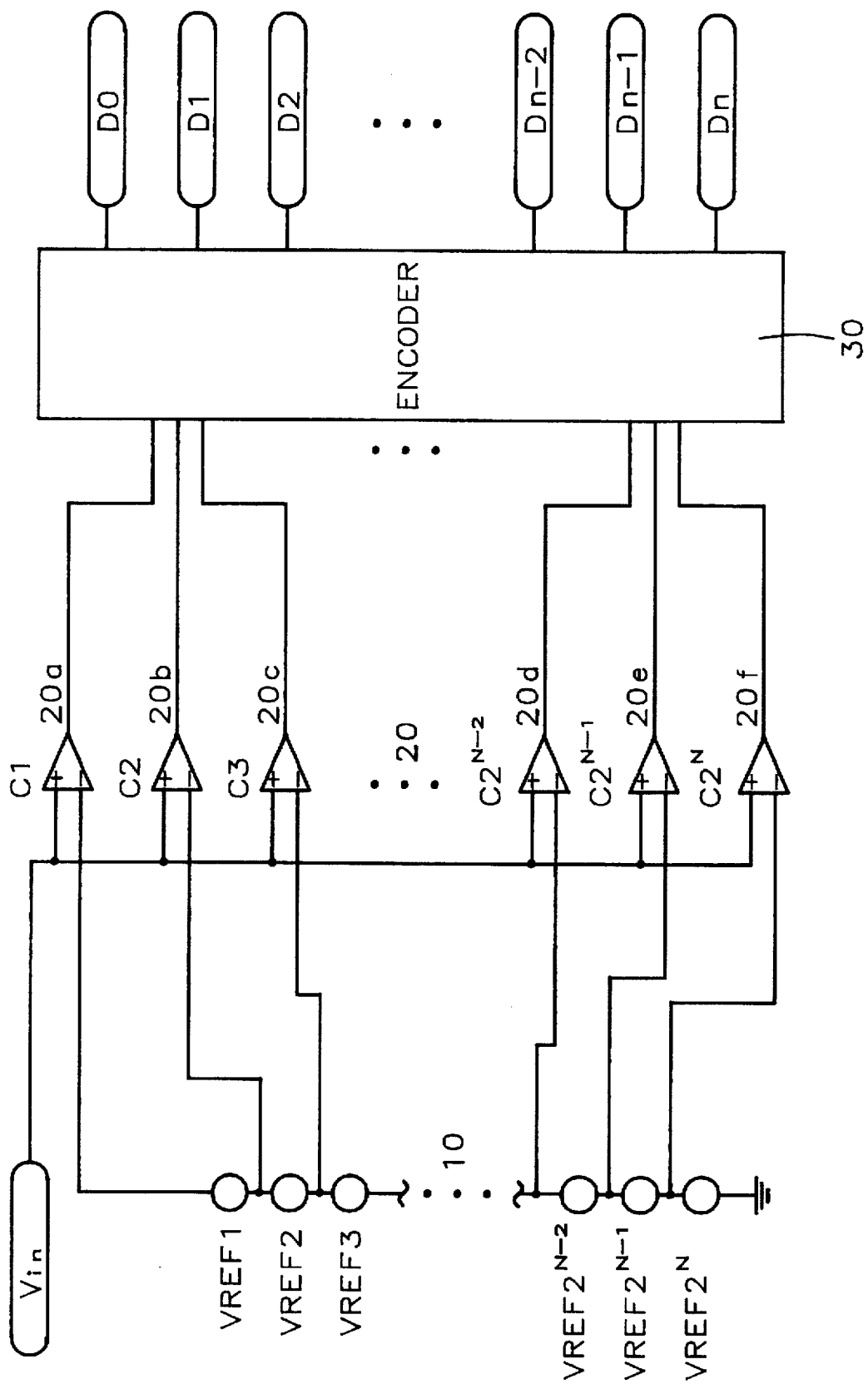
FIG. 1 is a schematic drawing illustrating the prior art of parallel or Flash A/D converter.
Figure 2:
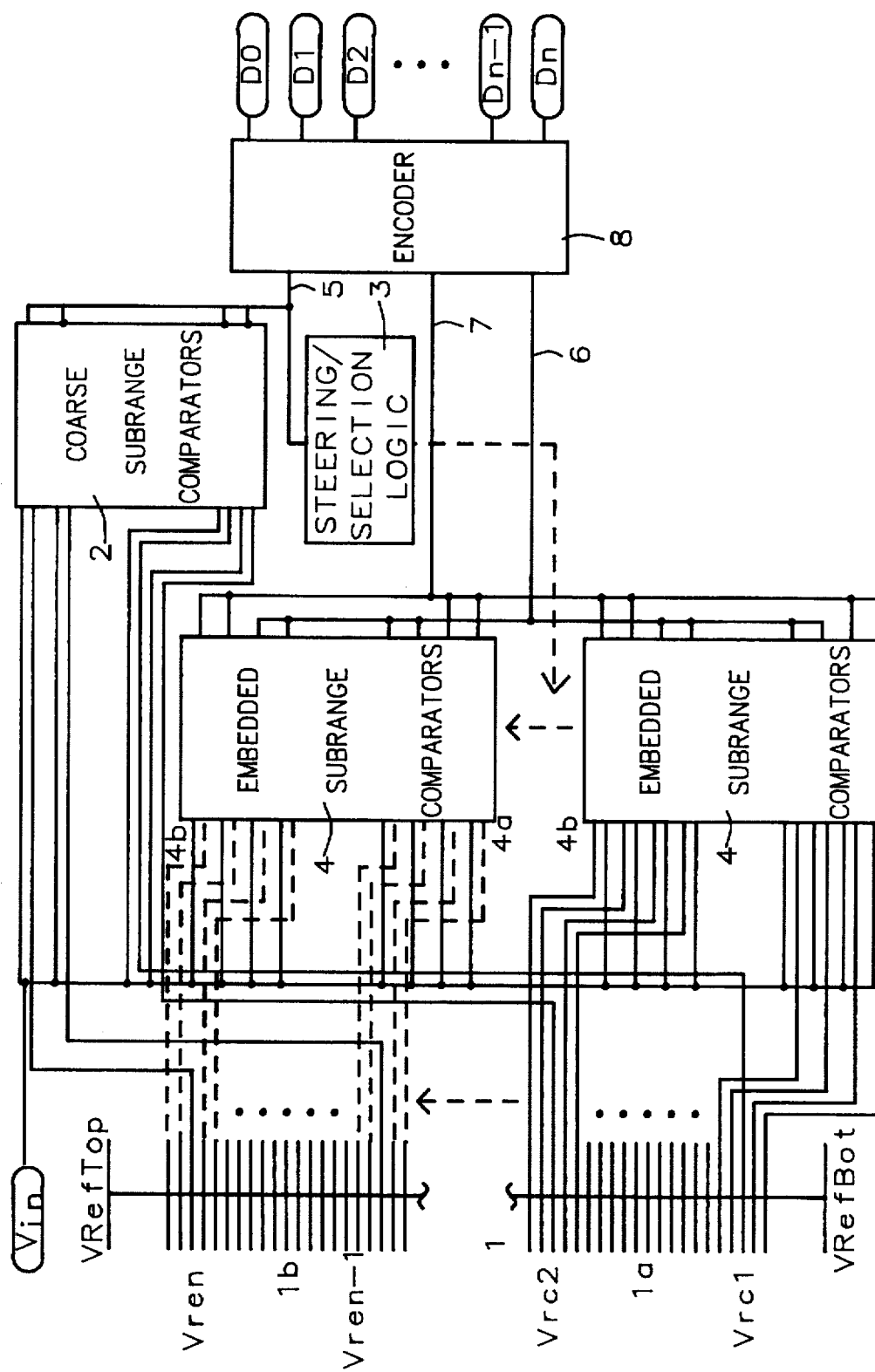
FIG. 2 is a schematic diagram of prior art illustrating a two stage A/D converter.
Figure 3:
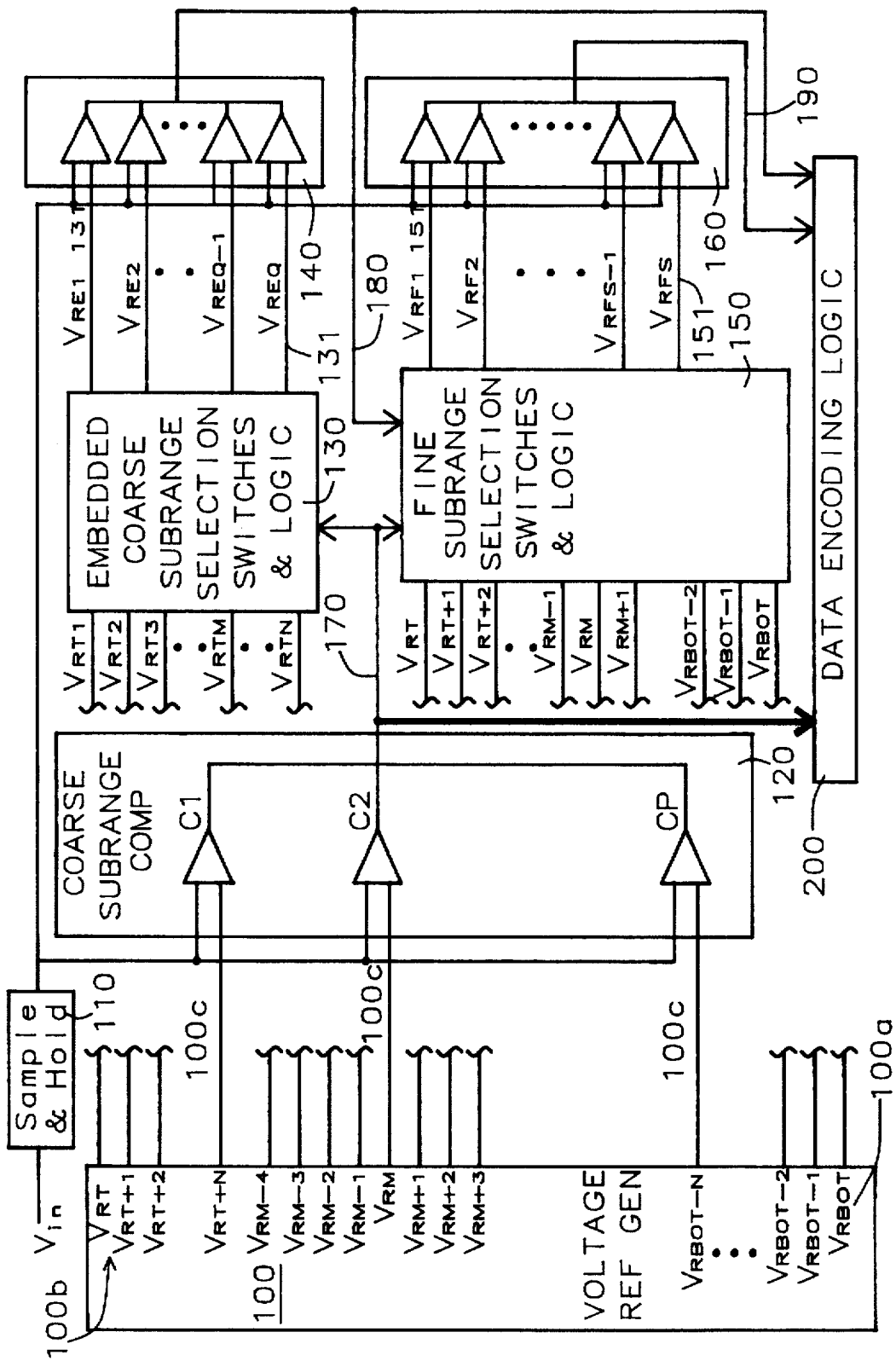
FIG. 3 is a schematic diagram of prior art illustrating an embedded subranging A/D converter.
Figure 4:
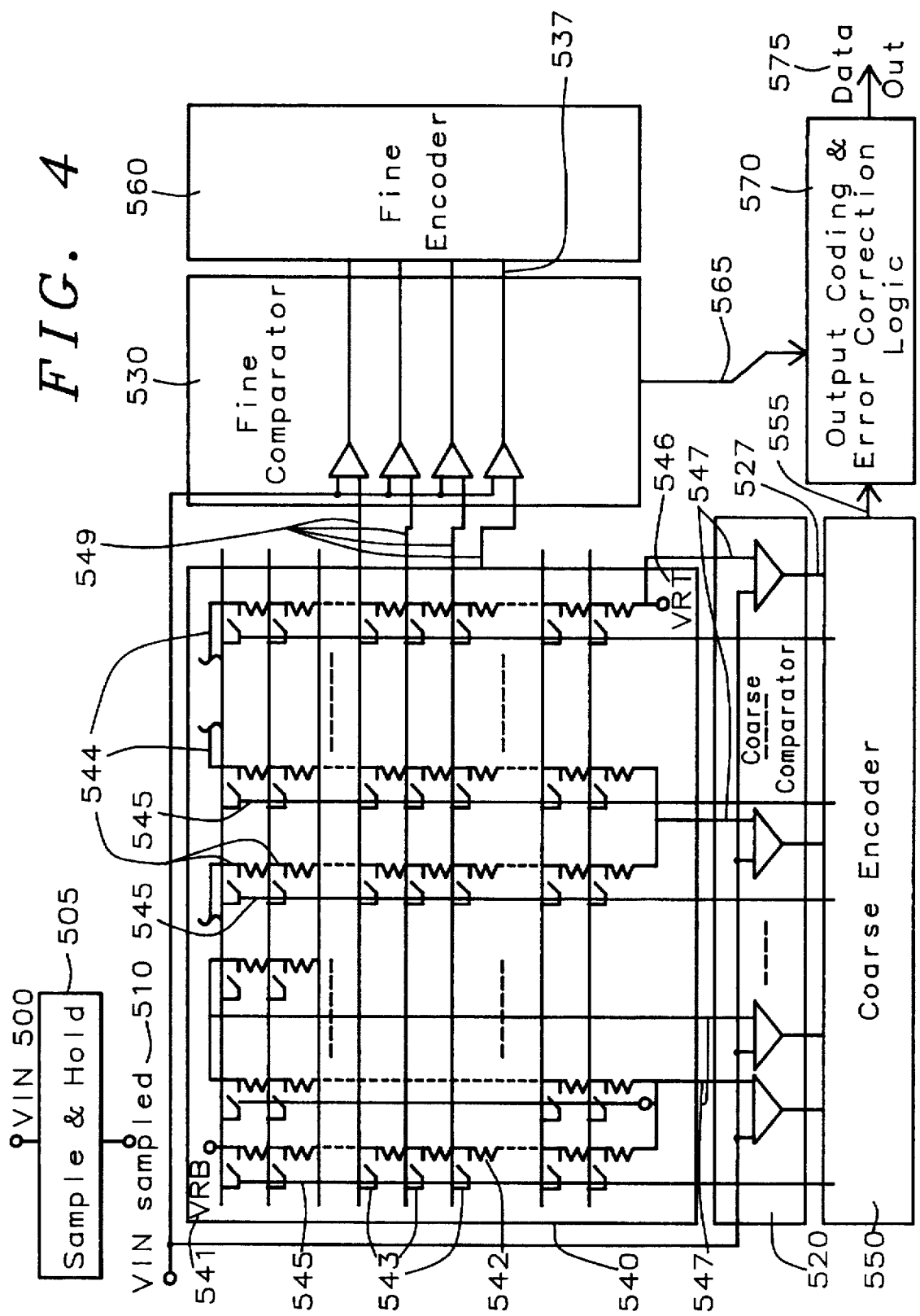
FIG. 4 is a schematic diagram of a Two Step A/D Converter of this invention.

Referring to FIG. 4, the analog input voltage ($V_{in}$) 500 is connected to a sample and hold circuit 505 to periodically sample the ($V_{in}$) 500 and retain it as the sampled analog input voltage 510.

The voltage reference generator 540 is connected between voltage reference sources $V_{RB}$ 541 and $V_{RT}$ 546. The voltage reference generator 540 creates a plurality of reference voltages 544 that are incrementally increasing from $V_{RB}$ 541 to 546. The increment of the reference voltages 544 will be determined as:

$$\frac{V_{RB} - V_{RB}}{2^n}$$

where n is the number of bits in the digital output code 575. The plurality of reference voltages 544 is connected to the voltage reference switching network that is formed by the plurality of switches 543. The coarse set of voltage references 547 are extracted from the plurality of reference voltages 544 and permanently connect to the coarse set of voltages comparators 520. The sampled analog input voltage 510 is compared to the coarse set of voltage references 546. The results of the comparison is a coarse thermometer code 527 (a thermometer coded is a binary code that is formed by each successive digit of the code changing to a "1" as the code increases, for example:

0000 The lowest value of the code
0001
0011
0111
1111 The highest value of the code).

The coarse thermometer code 527 the selection of the appropriate switch selection lines 545. The switch selection lines 545 are connected to the voltage reference switching network that is formed by the plurality of switches 543 to activate the appropriate switches 543 to connect a set of the plurality of references 544 to create the fine voltage references 549.

The fine voltage references 549 are connected to the fine comparators 530. The sampled analog input voltage 510 is compared in the fine comparators 530 to the fine voltage references 549 to form the fine thermometer codes 537. The fine thermometer codes 537 are connected to the fine encoders 560. The fine encoders create the fine digital codes 565.

The coarse digital codes 555 and the fine digital codes 565 are transferred to the output encoder 570, where they are converted to the output digital code 575. The output digital code 575 is a binary number representing the magnitude of the analog input voltage ($V_{in}$) 500. The coarse digital code 555 is resolved into the set of most significant bits of the binary number. The fine digital codes 565 are resolved into a set of least significant bits of the binary number. The fine digital codes 565 also provide an error correction factor to the most significant bits. fine encoder 560 of FIG. 4, the fine digital codes 590 are formed based on the value of the fine thermometer codes 537.

Figure 5A:
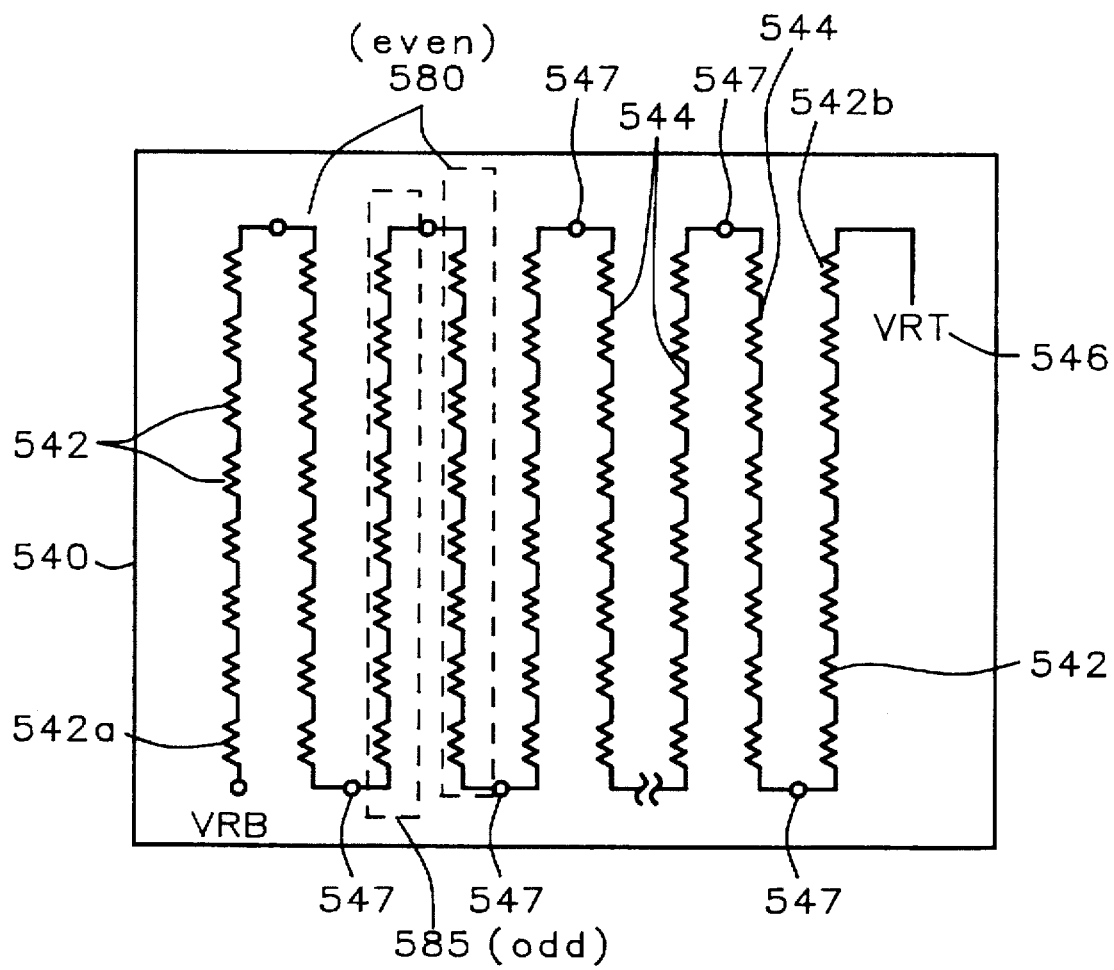
FIG. 5a–c are schematic diagrams of the voltage reference generator of this invention.
Figure 5B:
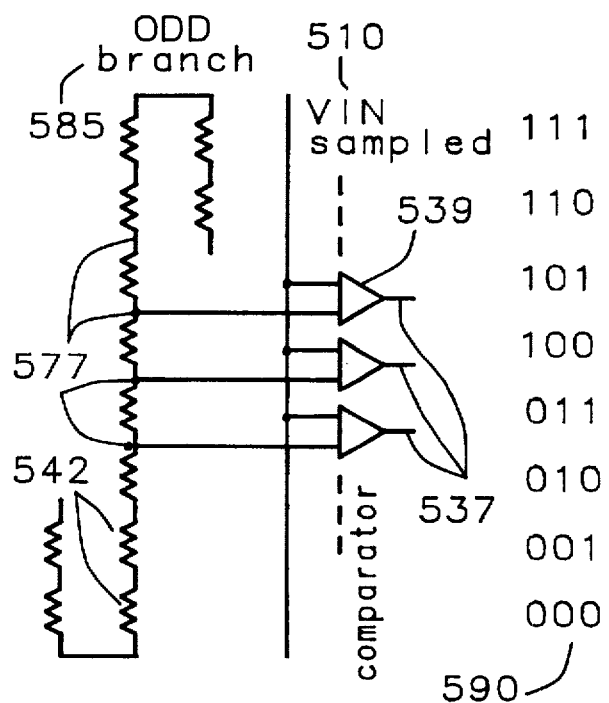
Figure 5C:
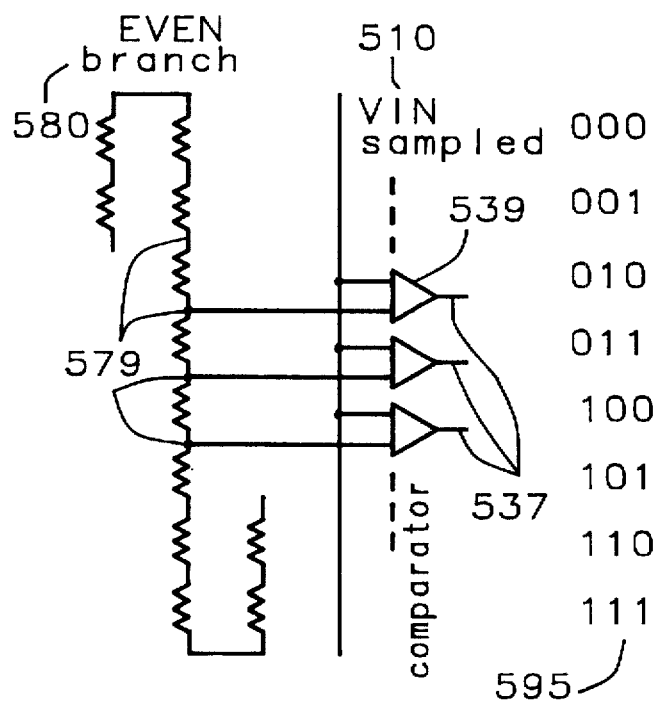

However, if an even branch 580 is selected as shown in FIG. 5c, the fine voltage references 579 are connected to the comparators 539. As before, the comparators 539 for the fine thermometer code 537, when compared with the sampled $V_{in}$ 510. Now the fine encoder 560 of FIG. 4 forms the fine digital code 595 based on the value of the fine thermometer codes 537.

Figure 6:
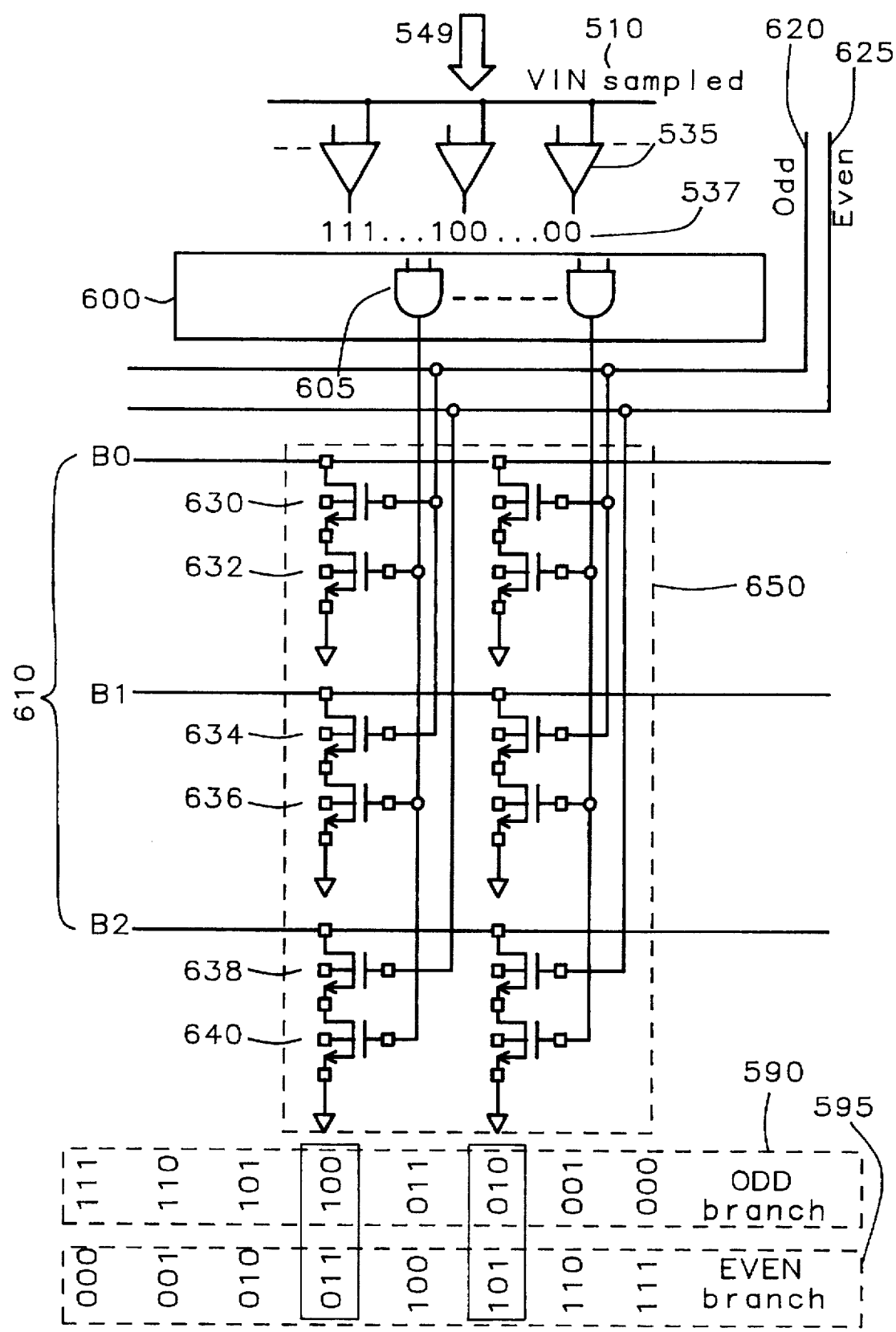
FIG. 6 is schematic of a fine encoder of this invention.

FIG. 6 illustrates the fine encoder 560 of FIG. 4. As in FIG. 4, the fine reference voltages 549 are compared to the sampled $V_{in}$ 510 in the comparators 535 to form the fine thermometer codes 537.

The thermometer codes are the input to the NAND array 600. Two adjacent bits of the thermometer code 537 are logically combined in a gate of the NAND array 600. The output of the NAND array 600 is a logical 0 if the two adjacent bits of the thermometer code 536 are equal and a logical 1 if the two adjacent bits of the thermometer code 536 are not equal. Since the structure of the codes is such that only one set of the two adjacent bits of the thermometer codes 537 are not equal, all of the outputs of the NAND array 600 will be a logical 0 except for the boundary between the logical 0's and the logical 1's of FIG. 5a illustrates the voltage reference generator (540 of FIG. 4). reference voltage supply $V_{RB}$ 541 is connected to resistor 542a and reference voltage supply $V_{RT}$ 546 is connected to resistor 542b. The plurality of serially connected resistors 542 for a voltage divider where at each connection of the plurality of serially connected resistors 542 is one of the reference voltages (544 of FIG. 4).

The voltage references for the coarse comparators (550 of FIG. 4) are generated at the juncture of the even 580 and odd 585 columns. These voltage references are permanently connected to the coarse comparators (520 of FIG. 4). The voltage references that are available for the fine comparators 549 are the junctures of the individual resistors 542. These connections are determined by the coarse thermometer code 527 and connected through the voltage reference switching network formed by the plurality of switches 543 to the fine comparators (530 of FIG. 4).

FIG. 5b illustrates an example of the selection of an odd branch 585 of the voltage reference generator 540 of FIG. 5a. The comparators 539 of the set of fine comparators (530 of FIG. 4) are connected through the voltage reference selection switches 543 of FIG. 4 to the fine reference voltages 577. The sampled $V_{in}$ 510 is compared to the fine reference voltages 577 and depending upon the magnitude of the sampled $V_{in}$ 510, form the fine thermometer codes 537. In the the thermometer codes 537, which will have the logical 1 at the output of the NAND array 600.

The lines B0, B1, and B2 610 contain a base ROM coding for the output of the fine encoder 560 of FIG. 4. The code selection circuitry 659 modifies the base ROM coding to form the correct output fine digital code 565 of FIG. 4. The code selection circuitry 650 comprises a plurality of N-channel Metal Oxide Semiconductor Transistors (NMOST's) configured to modify the logical value of the lines B0, B1, and B2 610.

If the thermometer code 537 has a value that has the output of NAND gate 605 as a logical 1, NMOST's 632, 636, and 640 are placed in the conducting state. If the Odd branch 620 was chosen by the evaluation of the coarse thermometer codes 527 of FIG. 4, then NMOST's 630 and 634 are activated and the output of the fine encoder (560 of FIG. 4) has a value of 100 of the Odd branch 590 codes. However, if the Even branch 625 was chosen by the evaluation of the coarse thermometer codes 527 of FIG. 4, the NMOST 640 is activated and the fine encoder (560 of FIG. 4) has the value 011 of the Even branch 595 codes. These codes 590 and 595 are the fine digital codes 565 of FIG. 4.

Figure 7:
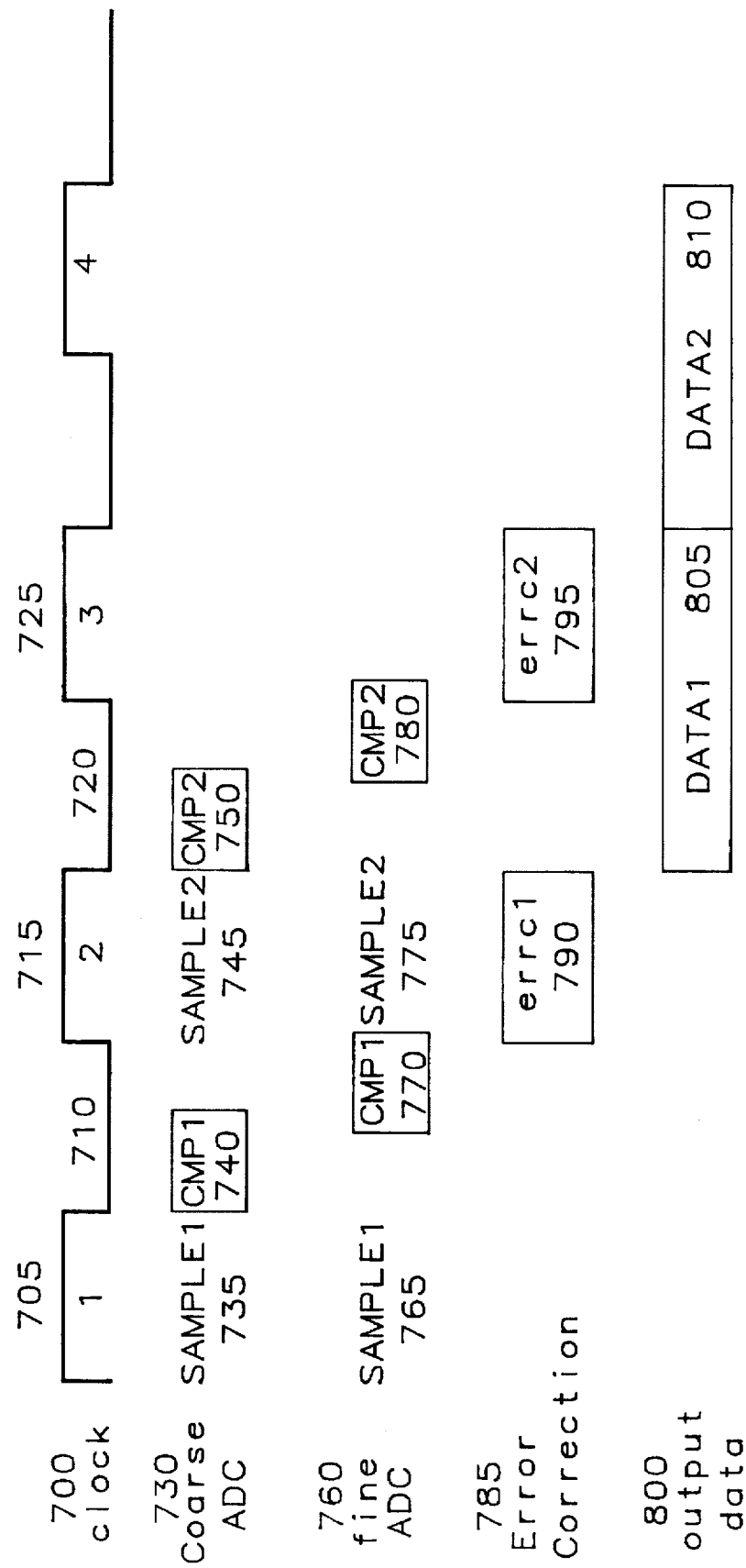
FIG. 7 is a timing diagram of a conversion cycle of this invention

Referring to FIG. 7, the clock 700 determines the sampling time of the Sample and Hold circuit 505 of FIG. 4 and the times for the compare for the coarse comparators 520 of FIG. 4 and the fine comparators 560 of FIG. 4 During the first half cycle 705 of the clock 700, the coarse ADC 730 and the fine ADC 760 are presented with a sample 735 and 765 of the input voltage. The coarse ADC compare 740 happens during the beginning of the second half cycle 710. The results of the compare is used to determine the coarse digital codes 555 of FIG. 4 and the settings of the plurality of switches 543 of FIG. 4 to allow the fine ADC 760 to compare the sampled $V_{in}$ 510 of FIG. 4 to the fine reference voltages 549 of FIG. 4. This comparison 770 happens at the end of the second half cycle 710 and the results are the fine digital codes 565 of FIG. 4. The fine digital codes 565 of FIG. 4 and the coarse digital codes 555 of FIG. 4 are combined and corrected in the output coding and error correction logic 570 of FIG. 4 during the first half 790 of the second cycle 715 to form the output digital code 575 of FIG. 4 is valid as Data 1 805 during the second half of the second cycle 720.

This process can be overlapped with the coarse ADC sampling 745 and fine ADC sampling 775 happening during the first half of the second cycle 715. The coarse and fine comparisons 750 and 780 and their resolutions to the fine and coarse digital codes 555 and 565 of FIG. 4 take place during the second half of the second cycle 720. The fine and coarse digital codes 555 and 565 of FIG. 4 are combined and corrected 795 during the first half of the third cycle 725 to form the output digital code 575 of FIG. 4. The output digital code Data 2 810 is valid during the following cycle.

The sampling, comparison, and output correction and encoding are overlapped such that a digital output code is available during every cycle of the clock 700 after the first cycle 705 and 710.

While the invention has been particularly shown and described with reference to the preferred embodiments thereof, it will be understood by those skilled in the art that various changes in form and details may be made without departing from the spirit and scope of the invention.

What is claimed is:

1. A two stage analog-to-digital converter to convert an analog input signal voltage to an output digital code having x bits, wherein x is the number of bits in said output digital code, that represents a magnitude of said analog input signal voltage, comprising:

a) an input sampling means that will capture during a first half clock cycle and retain an instantaneous sample of the analog input signal voltage;

b) a coarse comparison means that will compare the instantaneous sample of the analog input signal voltage to a plurality of coarse reference voltages to create a coarse digital thermometer code representing a coarse estimation of the magnitude of the instantaneous sample of the analog input signal voltage during a beginning period of the a second half cycle;

c) a fine comparison means that will compare the instantaneous sample of the analog input signal voltage to a subset of a plurality of fine reference voltages to create a fine digital thermometer code representing a refinement of the coarse estimation of the magnitude of the instantaneous sample of the analog input signal voltage during a ending period of the second half cycle;

d) a voltage reference generator coupled between a first reference voltage source and a second reference voltage source to generate the plurality of coarse reference voltages and the plurality of fine reference voltages;

e) a voltage reference selection switch network to selectively couple an appropriate subset of the plurality of fine reference voltages to the fine comparison means;

f) a voltage reference switch logic means to activate a portion of the voltage reference selection switch network as determined by the coarse digital thermometer code;

g) a coarse encoder to translate the coarse digital thermometer codes to a most significant portion of the output digital code;

h) a fine encoder to translate the fine digital thermometer codes to a least significant portion of the output digital code, wherein said fine encoder comprises:
   a thermometer code interpreter array having a plurality of thermometer code inputs connected to the fine digital thermometer codes, an array of logical decision means to determine a boundary bit between the first logical state and the second logical state of the fine digital thermometer code, and an interpreter output to transfer the boundary bit; and
   a read only memory containing all possible least significant portions of the output digital code, wherein the boundary bit and an even or odd column selection bit selects an appropriate least significant portion of the output digital code; and i) an output code correction means to adjust the most significant portion of the output digital code to correct any error created in the coarse comparison means and transfer an adjusted output digital code to circuitry external to said two step analog-to-digital converter.

2. The analog-to-digital converter of claim 1 wherein the input sampling means will capture and retain the instantaneous sample at regular period of a clocking pulse, wherein second clocking pulse comprises the first half cycle and the second half cycle such that the first half cycle precedes the second half cycle.

3. The analog-to-digital converter of claim 1 wherein the coarse comparison means comprises a plurality of coarse voltage comparators wherein each voltage comparator comprises a sampled input port connected to the instantaneous sample of the analog input signal voltage, a voltage reference port connected to the coarse reference voltages, and a compare output port, which will have a first logic state if the instantaneous sample of the analog input signal voltage is greater than the coarse reference voltage and a second logic state if the instantaneous sample of the analog input signal voltage is less than the coarse reference voltage.

4. The analog-to-digital converter of claim 3 wherein the plurality of coarse voltage comparators further comprises $2^n$ comparators, where n is the number of bits in the most significant portion of the output digital code.

5. The analog-to-digital converter of claim 1 wherein the fine comparison means comprises a plurality of fine voltage comparators wherein each voltage comparator comprises a sampled input port connected to the instantaneous sample of the analog input signal voltage, a voltage reference port connected to the fine reference voltages, and a compare output port, which will have a first logic state if the instantaneous sample of the analog input signal voltage is greater than the fine reference voltage and a second logic state if the instantaneous sample of the analog input signal voltage is less than the fine reference voltage.

6. The analog-to-digital converter of claim 5 wherein the plurality of fine voltage comparators further comprises $2^{n-x}$, comparators, where n−x is the number of bits in the least significant portion of the output digital code.

7. The analog-to-digital converter of claim 1 wherein the voltage generator comprises a plurality of resistors serially coupled between the first reference voltage source and the second voltage source to form a voltage divider network, wherein a voltage developed at each coupling of the plurality of resistors is one of the voltages of the plurality of coarse reference voltages and the plurality of fine reference voltages.

8. The analog-to-digital converter of claim 7 wherein each resistor of the plurality of resistors has an equal value of resistance such that the voltage developed at each coupling of the plurality of resistors is of an equal magnitude.

9. The analog-to-digital converter of claim 7 wherein the number of resistors in the plurality of resistors is $2^x$.

10. The analog-to-digital converter of claim 7 wherein the coarse reference voltages are spaced at $2^n$ increments of the voltage divider network.

11. The analog-to-digital converter of claim 1 wherein the fine reference voltages are space at $2^{n-x}$ increments between each of the coarse reference voltages.

12. The analog-to-digital converter of claim 1 wherein the plurality of resistors are organized into a plurality of columns of resistors such that the coarse reference voltages are placed at the top and bottom of each column and the fine reference voltages are distributed across each column of the plurality of columns of resistors.

13. The analog-to-digital converter of claim 12 wherein the plurality of columns of resistors are further comprising a set of even columns and a set of odd columns, wherein each even column is alternated with an odd column.

14. The analog-to-digital converter of claim 1 wherein the voltage reference selection switch network comprises a plurality of switches wherein each switch is connected to one of the fine reference voltages and will selectively couple one of the fine reference voltages to one of the plurality of fine voltage comparators as determined by the voltage reference selection logic means.

15. The analog-to-digital converter of claim 1 wherein the coarse digital thermometer code will determine the selection of the column of plurality of columns coupled through the voltage reference selection switch network to the fine comparison means.

16. An analog-to-digital converter for the conversion in two steps of a sampled analog input signal voltage to an output digital code, having x bits, wherein x is the number of bits in said output digital code, that represents a magnitude of said analog input signal voltage, comprising:

a) an input sampling means that will capture and retain the sampled analog input signal voltage instantaneously at interval periods from an analog input signal voltage during a first half cycle;

b) a coarse analog-to-digital converter having a first plurality of comparator circuits to compare the sampled analog inputs signal voltage to a plurality of coarse reference voltages to create coarse digital thermometer code representing a coarse estimation of the magnitude of said sampled analog input signal voltage during a beginning period of a second half cycle;

c) a fine analog-to-digital converter having a second plurality of comparator circuits to compare the sampled analog input signal voltage to a portion of a plurality of fine reference voltages to create a fine digital thermometer code that represents a refinement of the coarse estimation of said sampled analog input signal voltage during an ending period of the second half cycle;

d) A voltage reference generator connected between a first reference voltage source and second voltage reference source, comprising a plurality of serially connected resistors that form a voltage divider network, wherein a voltage developed at the juncture of tow of the serially connected resistors is one of the voltages of the plurality of coarse reference voltages and the plurality of fine reference voltages;

e) a voltage reference selection switch network to couple a selected portion of the plurality of fine reference voltages to the fine analog-to-digital converter, comprising a plurality of switched, wherein each switch is connected to the juncture of two of the plurality of serially connected resistors and will selectively couple one of the fine reference voltages to one of the comparators of the fine analog-to-digital converter;

f) a voltage reference selection switch logic means to activate a selected portion of the voltage reference selection switch network as determined by the coarse digital thermometer code;

g) a coarse analog-to-digital converter encoder to translate the coarse digital thermometer code to a most significant portion of the output digital code;

h) a fine analog-to-digital converter encoder to translate the fine digital thermometer code to a least significant portion of the output digital code, comprising a thermometer code interpreter array having a plurality of thermometer code inputs connected to the fine digital thermometer codes, an array of logical decision means to determine a boundary bit between the first logical state and the second logical state of the fine digital thermometer code, and an interpreter output to transfer the boundary bit; and a read only memory containing all possible least significant portions of the output digital code, wherein the boundary bit and an even or odd column selection bit selects an appropriate least significant portion of the output digital code.

i) an output code correction means to adjust the most significant portion of the output digital code to correct any error created in the coarse comparison means and transfer and adjusted output digital code to circuitry external to said two step analog-to-digital converter.

17. The analog-to-digital converter of claim 16 wherein the input sampling means will capture and retain the instantaneous sample at regular period of a clocking pulse, wherein said clocking pulse comprises the first half cycle followed by the second half cycle.

18. The analog-to-digital converter of claim 16 wherein each comparator of the coarse analog-to-digital converter comprises a sampled input port connected to the instantaneous sample of the analog input signal voltage, a voltage reference port connected to the coarse reference voltages, and a compare output port, which will have a first logic state if the instantaneous sample of the analog input signal voltage is greater than the coarse reference voltage and a second logic state if the instantaneous sample of the analog input signal voltage is less than the coarse reference voltage.

19. The analog-to-digital converter of claim 18 wherein the plurality of coarse voltage comparators further comprises $2^n$ comparators, where n is the number of bits in the most significant portion of the output digital code.

20. The analog-to-digital converter of claim 16 wherein each comparator of the fine analog-to-digital converter comprises a sampled input port connected to the instantaneous sample of the analog input signal voltage, a voltage reference port connected to the fine reference voltages, and a compare output port, which will have a first logic state if the instantaneous sample of the analog input signal voltage is greater than the fine reference voltage and a second logic state if the instantaneous sample of the analog input signal voltage is less than the fine reference voltage.

21. The analog-to-digital converter of claim 20 wherein the plurality of fine voltage comparators further comprises $2^{n-x}$ comparators, where n−x is the number of bits in the least significant portion of the output digital code.

22. The analog-to-digital converter of claim 16 wherein each resistor of the plurality of resistors has an equal value of resistance such that the voltage developed at each coupling of the plurality of resistors is of an equal magnitude.

23. The analog-to-digital converter of claim 16 wherein the number of resistors in the plurality of resistors is $2^x$.

24. The analog-to-digital converter of claim 16 wherein the coarse reference voltage s are spaced at $2^n$ increments of the voltage divider network.

25. The analog-to-digital converter of claim 16 wherein the fine reference voltages are space at $2^{n-x}$ increments between each of the coarse reference voltages.

26. The analog-to-digital converter of claim 16 wherein the plurality of resistors are organized into a plurality of columns of resistors such that the coarse reference voltages are placed at the top and bottom of each column and the fine reference voltages are distributed across each column of the plurality of columns of resistors.

27. The analog-to-digital converter of claim 16 wherein the plurality of columns of resistors are further comprising a set of even columns and a set of odd columns, wherein each even column is alternated with an odd column.

28. The analog-to-digital converter of claim 16 wherein the coarse digital thermometer code will determine the selection of the column of plurality of columns coupled through the voltage reference selection switch network to the fine comparison means.

* * * * *